US010886356B2

(12) United States Patent
Lu et al.

(10) Patent No.: US 10,886,356 B2
(45) Date of Patent: Jan. 5, 2021

(54) DISPLAY PANEL WITH HIGH STABILITY

(71) Applicant: BOE TECHNOLOGY GROUP CO., LTD., Beijing (CN)

(72) Inventors: Pengcheng Lu, Beijing (CN); Kuanta Huang, Beijing (CN); Xiaochuan Chen, Beijing (CN); Shengji Yang, Beijing (CN); Hui Wang, Beijing (CN); Yanming Wang, Beijing (CN); Weihai Wang, Beijing (CN); Guohong Qin, Beijing (CN); Rongrong Shi, Beijing (CN); Yage Song, Beijing (CN); Jiantong Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/394,254

(22) Filed: Apr. 25, 2019

(65) Prior Publication Data

US 2020/0075706 A1 Mar. 5, 2020

(30) Foreign Application Priority Data

Aug. 30, 2018 (CN) .......................... 2018 1 1004887

(51) Int. Cl.

*H01L 27/32* (2006.01)
*H01L 27/12* (2006.01)
*H01L 51/52* (2006.01)

(52) U.S. Cl.

CPC ........ *H01L 27/3276* (2013.01); *H01L 27/124* (2013.01); *H01L 27/1259* (2013.01); *H01L 51/5203* (2013.01)

(58) Field of Classification Search

CPC ............... H01L 27/3276; H01L 27/124; H01L 27/1259; H01L 51/5203; H01L 27/3244; H01L 27/3248

(Continued)

(56) References Cited

U.S. PATENT DOCUMENTS 10,553,658 B2 * 2/2020 Oh ...................... H01L 51/5246
2009/0115321 A1 * 5/2009 Hayashi .............. H01L 51/5246 313/504

(Continued)

FOREIGN PATENT DOCUMENTS

CN 101425533 A 5/2009
CN 104508848 A 4/2015

OTHER PUBLICATIONS

2nd Office Action dated Sep. 10, 2020 for Chinese Patent Application No. 201811004887.6.

*Primary Examiner* — Mohammad M Hoque
(74) *Attorney, Agent, or Firm* — Thomas | Horstemeyer, LLP

(57) ABSTRACT

A display panel includes a base substrate, a first electrode contact portion, a light emitting layer, and a first electrode. The first electrode contact portion is disposed on the base substrate and surrounding a display area, and is separated from the display area by an isolation area. The light emitting layer covers the display area and at least a portion of the isolation area, and extends at least partially to an inner edge of the first electrode contact portion or a surface of the first electrode contact portion away from the base substrate. The first electrode is disposed on the light emitting layer and a portion of the first electrode contact portion that is not covered by the light emitting layer.

17 Claims, 5 Drawing Sheets

(58) Field of Classification Search
USPC ............................................................ 257/40
See application file for complete search history.

(56) References Cited

U.S. PATENT DOCUMENTS

| | | | | |
|---|---|---|---|---|
| 2013/0056714 | A1* | 3/2013 | Hasegawa | H01L 27/3276 257/40 |
| 2015/0084026 | A1* | 3/2015 | Miyamoto | H01L 27/3241 257/40 |
| 2015/0214508 | A1* | 7/2015 | Sakairi | H01L 51/0015 257/40 |
| 2016/0126498 | A1* | 5/2016 | Kim | H01L 51/5234 257/40 |
| 2016/0148562 | A1* | 5/2016 | Jung | H01L 51/5246 345/212 |
| 2016/0351093 | A1* | 12/2016 | Kim | G09G 3/2092 |
| 2017/0373128 | A1* | 12/2017 | Lee | H01L 27/3276 |
| 2018/0006273 | A1* | 1/2018 | Kim | H01L 51/5275 |
| 2018/0348918 | A1* | 12/2018 | Rhe | H01L 27/323 |
| 2018/0366680 | A1* | 12/2018 | Okigawa | H01L 27/3276 |
| 2019/0081129 | A1* | 3/2019 | Sung | H01L 51/5253 |
| 2019/0148469 | A1* | 5/2019 | Lhee | H01L 27/3246 257/40 |
| 2019/0148672 | A1* | 5/2019 | Seo | H01L 51/5237 257/40 |
| 2020/0027937 | A1* | 1/2020 | Kodama | G09G 3/3241 |

* cited by examiner

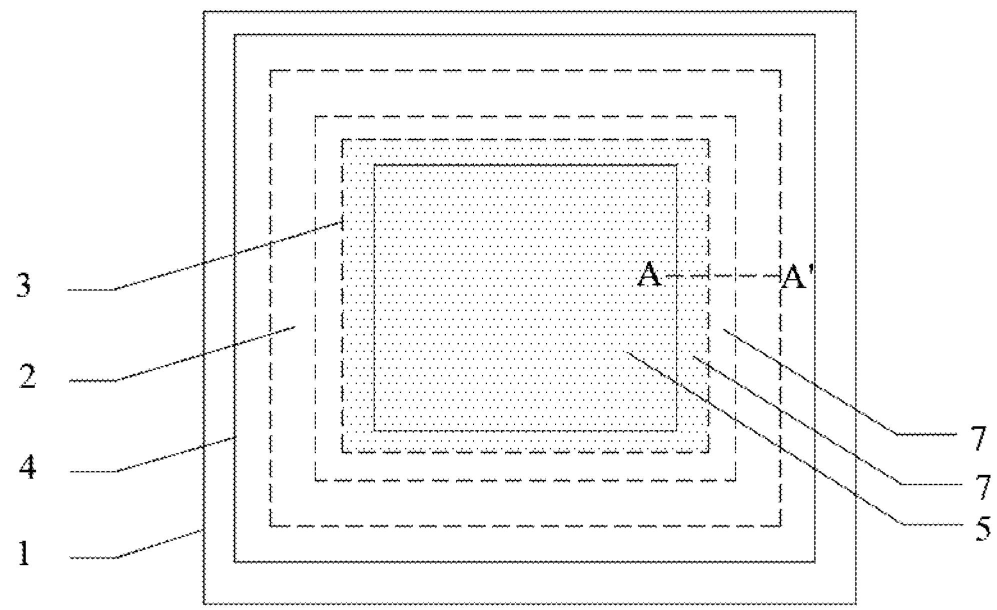
FIG. 1 *(Prior Art)*
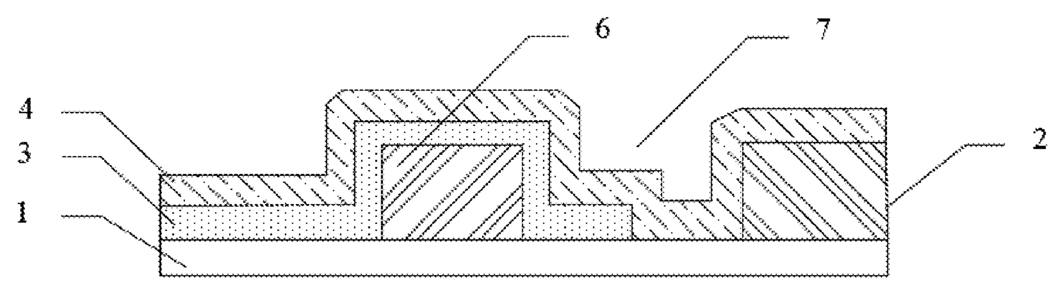
FIG. 2 *(Prior Art)*

DISPLAY PANEL WITH HIGH STABILITY

CROSS-REFERENCE TO RELATED APPLICATIONS

The present application claims the benefit of and priority to Chinese Patent Application No. 201811004887.6 and filed Aug. 30, 2018, the entire contents of which are incorporated herein by reference.

TECHNICAL FIELD

The present disclosure relates to the technical field of display panels, and more particularly to a display panel, a manufacturing method thereof, and a display device.

BACKGROUND

With the development of organic light emitting technology, the application of OLED is more and more extensive. With respect to an OLED display panel, the stability of the connection between the first electrode and the first electrode contact portion is crucial to improve the stability and yield of the display panel.

The above information disclosed in the Background section is only used to enhance an understanding of the background of the present disclosure, and thus it may include information that does not constitute a prior art known to those of ordinary skill in the art.

BRIEF SUMMARY OF INVENTION

According to a first aspect of the present disclosure, there is provided a display panel having a display area, wherein the display panel includes:

a base substrate, a first electrode contact portion disposed on the base substrate and surrounding a display area, and the first electrode contact portion being separated from the display area by an isolation area; and a light emitting layer covering the display area and at least a portion of the isolation area, and extending at least partially to an inner edge of the first electrode contact portion or a surface of the first electrode contact portion away from the base substrate; and a first electrode disposed on the light emitting layer and a portion of the first electrode contact portion that is not covered by the light emitting layer.

In an exemplary embodiment of the present disclosure, the light emitting layer extends partially to a surface of the first electrode contact portion away from the base substrate; a direction in which the first electrode contact portion is away from the display area is a first direction; and a width of the portion the light emitting layer covering the first electrode contact portion in the first direction is smaller than a width of the surface of the first electrode contact portion away from the base substrate in the first direction.

In an exemplary embodiment of the present disclosure, a width of a portion of the light emitting layer covering the first electrode contact portion in the first direction is 50% of the width of the surface of the first electrode contact portion away from the base substrate in the first direction.

In an exemplary embodiment of the present disclosure, the light emitting layer includes:

a light emitting layer body covering the display area and a portion of the isolation area, and an edge of the light emitting layer body is located in the isolation area; and at least one convex portion extending to the inner edge of the first electrode contact portion or the surface of the first electrode contact portion away from the base substrate.

In an exemplary embodiment of the present disclosure, a length of an edge of the light emitting layer body connected to the convex portion is 50% of a length of an edge of the light emitting layer body.

In an exemplary embodiment of the present disclosure, the convex portion is one of multiple convex portions, and the multiple convex portions are connected to the edge of the light emitting layer body at intervals.

In an exemplary embodiment of the present disclosure, the display area is circular, and the first electrode contact portion is a circle concentric with the display area;

an orthographic projection of the light emitting layer body on the base substrate is a circle concentric with the display area;

an orthographic projection of the convex portion on the base substrate is a fan shape centered on a center of the display area, and an outer radius of the convex portion is smaller than an outer radius of the first electrode contact portion and not smaller than an inner radius of the first electrode contact portion.

In an exemplary embodiment of the present disclosure, the convex portion is one of multiple convex portions, and the multiple convex portions are evenly distributed along an edge of the body of the light emitting layer.

In an exemplary embodiment of the present disclosure, the display area is rectangular, and the first electrode contact portion is a rectangular ring concentric with the display area;

a projection of the light emitting layer body on the base substrate is a rectangle concentric with the display area;

an orthographic projection of the convex portion on the base substrate is a rectangle, and an edge of the convex portion away from the light emitting layer body is located at the surface of the first electrode contact portion away from the substrate.

In an exemplary embodiment of the present disclosure, the number of the convex portions is four, and the four convex portions are connected to four sides of the light emitting layer body in a one-to-one correspondence.

In an exemplary embodiment of the present disclosure, each of the convex portions is connected between an end point and a midpoint of a side of the corresponding light emitting layer body.

In an exemplary embodiment of the present disclosure, the base substrate is a silicon-based substrate.

In an exemplary embodiment of the present disclosure, the display panel is an OLED display panel.

According to a second aspect of the present disclosure, there is provided a manufacturing method of a display panel, the display panel having a display area, wherein the manufacturing method of the display panel includes steps of:

obtaining a substrate;

forming a first electrode contact portion around the display area on a base substrate, the first electrode contact portion and the display area being separated by an isolation area;

forming a light emitting layer on the display area and at least a portion of the isolation area, and extending at least partially to an inner edge of the first electrode contact portion or a surface of the first electrode contact portion away from the base substrate; and forming a first electrode on the light emitting layer and a portion of the first electrode contact portion that is not covered by the light emitting layer.

According to a third aspect of the present disclosure, there is provided a display device including the display panel described above.

BRIEF DESCRIPTION OF THE DRAWINGS

The above and other features and advantages of the present disclosure will become more apparent from the detailed description of the exemplary embodiments with reference to the accompanying drawings.

FIG. 1 is a top plan view of a display panel in the related art.

FIG. 2 is a cross-sectional view taken along line AA' of FIG. 1.

DETAILED DESCRIPTION

Figure 3:
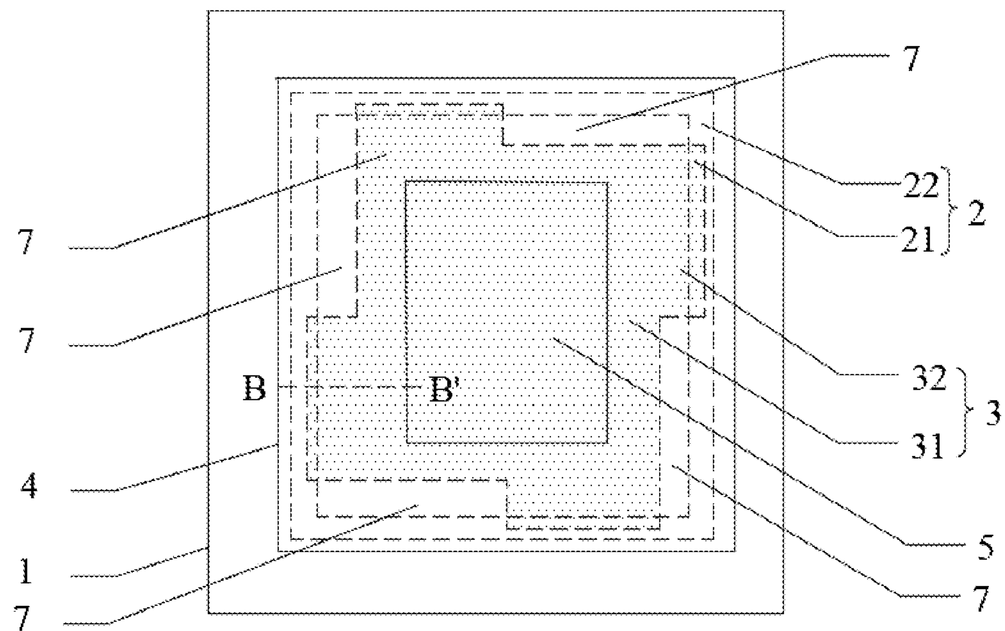
FIG. 3 is a schematic plan view of a display panel according to an embodiment of the present disclosure.

Exemplary embodiments will now be described more fully with reference to the accompanying drawings. However, the exemplary embodiments can be embodied in a variety of forms and should not be construed as being limited to the examples set forth herein. Rather, these embodiments are provided to make the present disclosure more thorough and complete, and to fully convey the concept of the exemplary embodiments to those skilled in the art. The described features, structures, or characteristics may be combined in any suitable manner in one or more embodiments. In the following description, numerous specific details are set forth to provide a thorough understanding of the embodiments of the present disclosure.

In the figures, the thickness of the regions and layers may be exaggerated for clarity. The same reference numerals in the drawings denote the same or similar structures, and thus their detailed description will be omitted.

The described features, structures, or characteristics may be combined in any suitable manner in one or more embodiments. In the following description, numerous specific details are set forth to provide a thorough understanding of the embodiments of the present disclosure. However, those skilled in the art will appreciate that the technical solutions of the present disclosure may be practiced without one or more of the specific details, or other methods, components, materials, etc. may be employed. In other instances, well-known structures, materials, or operations are not shown or described in detail in order to avoid obscuring the main technical idea of the disclosure.

Although the relative terms such as “on” and “under” are used in the specification to describe the relative relationship of one component to another component as illustrated, these terms are used in this specification for convenience only, for example, according to the exemplary direction shown in the accompanying drawings. It will be understood that if the device as illustrated is flipped upside down, the component described as “on” will become the component “under”. Other relative terms such as “high”, “low”, “top”, “bottom”, “left”, “right”, etc. also have similar meanings.

When a structure is “on” another structure, it may mean that the structure is integrally formed on the other structure, or that a structure is “directly” disposed on the other structure, or that a structure is “indirectly” disposed on the other structure through another structure.

The terms “a”, “an”, and “the” are used to mean the presence of one or more elements/components, etc. The terms “including” and “having” are used to mean nonexclusively containing and additional elements/components/etc. may be present in addition to the listed elements/components/etc.

The terms “first” and “second” are used as labels only, not limiting on the number of objects.

As shown in FIG. 1 and FIG. 2, a conventional OLED display panel includes a base substrate 1, a second electrode 6, and a first electrode contact portion 2, which are disposed on the base substrate 1, a first electrode 4 disposed on the second electrode 6 and connected to the first electrode contact portion 2, and a light emitting layer 3 disposed between the first electrode 4 and the second electrode 6. The display area 5 and the first electrode contact portion 2 are spaced apart, and the position between them is referred to as an isolation area 7. When the first electrode 4 is connected to the first electrode contact portion 2, the first electrode 4 is susceptible to breakage, such that the signal of the first electrode 4 cannot be supplied and the panel cannot normally display.

In the structure shown in FIGS. 1 and 2, the first electrode contact portion 2 may be connected to an external power source to supply power to the first electrode 4 (which may be, for example, a cathode). Since the first electrode contact portion 2 is in electrical contact with an external device, the thickness of the first electrode contact portion 2 is generally large. As the first electrode contact portion 2 and the second electrode 6 (which may be, for example, an anode) may be fabricated in the same patterning process (for example, the same may be employed), the thickness of the second electrode 6 is also large as that of the first electrode contact portion 2, in particular, compared to that of the light emitting layer 3 and the first electrode 4. Due to the difference in the thickness, the first electrode 4 is connected to the first electrode contact portion 2 with a large inclination angle. Therefore, the first electrode 4 is susceptible to breakage when being connected to the first electrode contact portion 2, such that the signal of the first electrode 4 cannot be supplied and the panel cannot display normally.

In view of the problems described above, a display panel having a display area 5 is provided in an embodiment of the present disclosure. The display panel may be circular, fan-shaped, rectangular, or other shaped, which is not specifically limited in the present disclosure. The type of the display panel may be OLED, LCD, or other type.

As shown in FIG. 3, FIG. 4, FIG. 5, and FIG. 6, the display panel includes a base substrate 1, a first electrode contact portion 2, a light emitting layer 3, and a first electrode 4. The first electrode contact portion 2 is disposed on the base substrate 1 and surrounds a display area 5, and is separated from the display area 5 by an isolation area 7. The light emitting layer 3 covers the display area 5 and at least a portion of the isolation area 7, and extends at least partially to an inner edge of the first electrode contact portion 2 or a surface of the first electrode contact portion 2 away from the base substrate 1. The first electrode 4 is disposed on the light emitting layer 3 and the portion of the first electrode contact portion 2 that is not covered by the light emitting layer 3.

In the display panel provided by the embodiment of the present disclosure, the light emitting layer 3 extends at least partially to the inner edge of the first electrode contact portion 2 or the surface of the first electrode contact portion 2 away from the substrate 1, such that the first electrode 4 can directly connect from the extension portion of the light emitting layer 3 to the first electrode contact portion 2, thereby reducing the inclination angle between the first electrode 4 and the first electrode contact portion 2. As a result, the first electrode 4 is less susceptible to breakage when being connected to the first electrode contact portion 2. This can ensure a sufficient overlap joint between the first electrode 4 and the first electrode contact portion 2, which can improve the stability and yield of the panel display.

Moreover, the extension portion of the light emitting layer 3 covers the corresponding isolation area 7, which can reduce the depth of this portion of the isolation area 7, such that the first electrode 4 provided on the extension portion of the light emitting layer 3 can be made more stable. Therefore, the first electrode 4 is more stable and even less susceptible to breakage at the junction of the isolation area 7 and the first electrode contact portion 2. It can reduce the risk of breakage in the isolation area of the first electrode 4 disposed in the extension portion of the light emitting layer 3, and further improve the stability and yield of the display panel.

The components of the display panel provided by the embodiments of the present disclosure are described in detail below with reference to the accompanying drawings.

Figure 8:
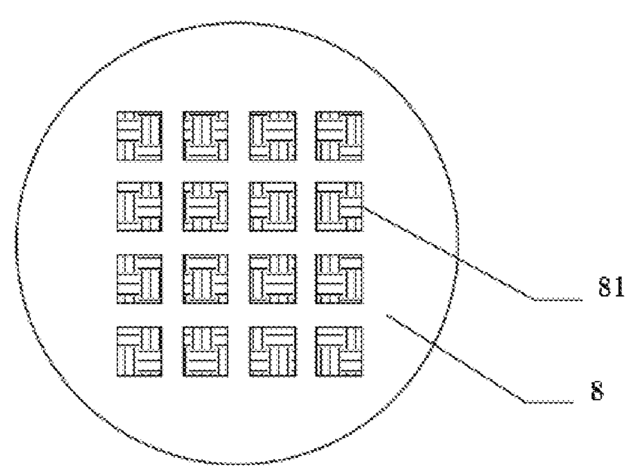
FIG. 8 is a schematic plan view of a semiconductor wafer according to an embodiment of the present disclosure.
Figure 9:
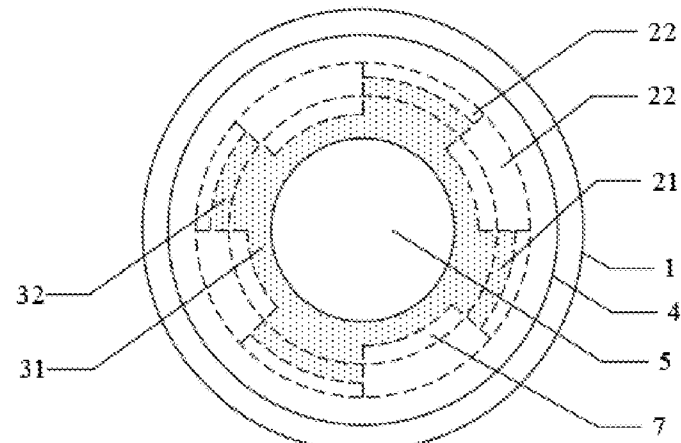
FIG. 9 is a schematic top plan view of a display panel according to another embodiment of the present disclosure.

As shown in FIG. 3 or FIG. 9, the shape of the base substrate 1 can be selected or adjusted according to the requirements of the display panel. For example, the base substrate 1 may be circular, fan-shaped, rectangular, or other shape. The base substrate 1 can be a silicon-based substrate or a glass substrate, etc., and those skilled in the art can select and apply according to actual needs. For example, with the advancement of VR/AR (Virtual Reality/Augmented Reality) technology and the rapid growth of the market, display panels suitable for VR/AR are also becoming miniaturized while having high PPI, fast response, and high color gamut. Therefore, those skilled in the art can select a silicon-based substrate and prepare a silicon-based OLED on this basis. As shown in FIG. 8, the silicon-based substrate may be a crystal grain 81 (Die) prepared on a semiconductor wafer 8 by a silicon-based semiconductor process, and the selected semiconductor wafer 8 may have a size of 8 inches or 12 inches.

Figure 5:
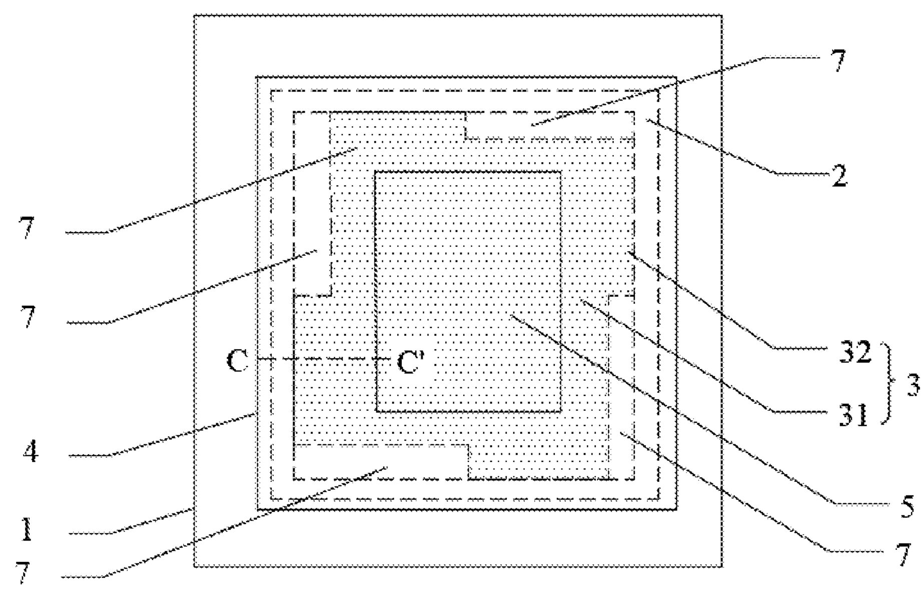
FIG. 5 is a schematic plan view of a display panel according to an embodiment of the present disclosure.

As shown in FIG. 3, FIG. 5 and FIG. 9, the first electrode contact portion 2 may have an annual structure and is isolated from the display area 5 by an isolation area 7. The purpose of the isolation area 7 is mainly to insulate the first electrode contact portion 2 from the second electrodes 6 distributed in an array in the display area 5, thereby avoiding interference between the signal of the first electrode 4 and the signal of the second electrodes 6. The isolation area 7 is an integral structure and is located between the display area 5 and the first electrode contact portion 2. FIG. 3, FIG. 5, and FIG. 9 are top views, from which it can be seen that the orthographic projection of at least a portion (shaded portion) of the edge of the light emitting layer 3 is located within the isolation area 7, such that the isolation area 7 seems to be divided by the edge of the light emitting layer 3 in visual effect. In an embodiment, the first electrode contact portion 2 can be electrically connected to the underlying circuit on the base substrate 1, and generally supply power to the first electrode 4 under the control of the underlying circuit.

Figure 10:
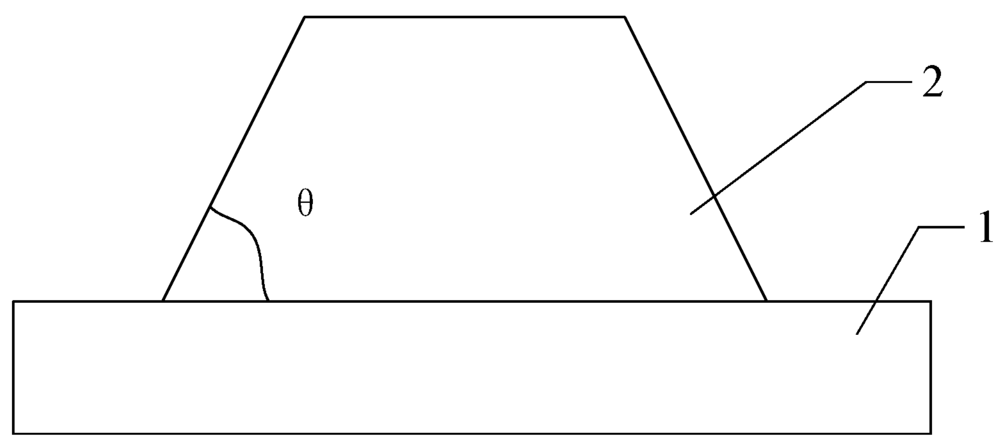
FIG. 10 is a schematic cross-sectional view showing a first electrode contact portion according to an embodiment of the present disclosure.

The shape of the first electrode contact portion 2 can be determined depending on process conditions and the like. For example, the lateral cross section of the first electrode contact portion 2 may be rectangular or trapezoidal, as shown in FIG. 10. In the related art, the side wall of the first electrode 4 in the isolation area 7 along the first electrode contact portion 2 close to the display area 5 is connected in an overlapped manner on the upper surface of the first electrode contact portion 2, and an angle θ between the side surface of the first electrode contact portion 2 and the base substrates 1 is the inclination angle of the overlapping, which is approximately 90°. Since the first electrode 4 is at the bottom end of the isolation area 7, the first electrode 4 is susceptible to breakage in the isolation area 7.

Figure 6:
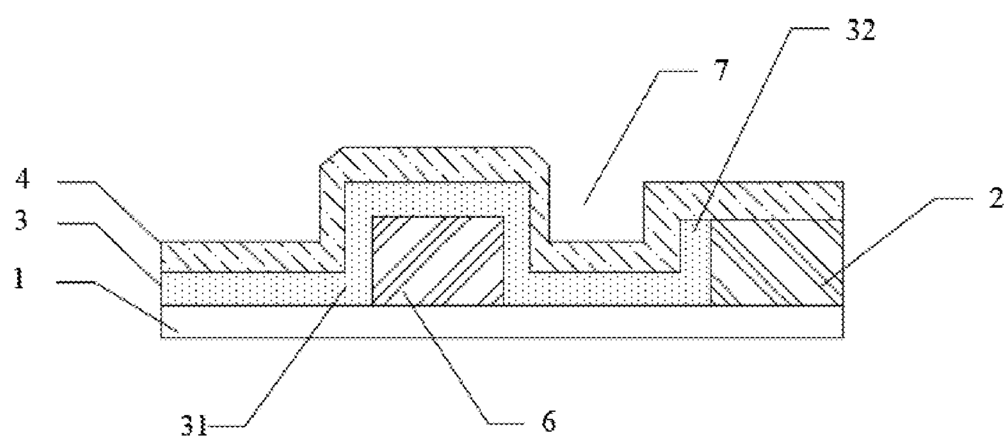
FIG. 6 is a cross-sectional view of CC' in FIG. 2.

As shown in FIG. 5 and FIG. 6, in an embodiment, the outer edge of the extension portion of the light emitting layer 3 may be flush with the inner edge of the first electrode contact portion 2 as can be seen in a plan view. In this regard, the first electrode 4 can be directly connected to the first electrode contact portion 2 from the extension portion of the light emitting layer 3. This is equivalent to raising the bottom end of the isolation area 7, and can prevent the first electrode 4 from being broken when being overlapped with the first electrode contact portion 2.

Figure 4:
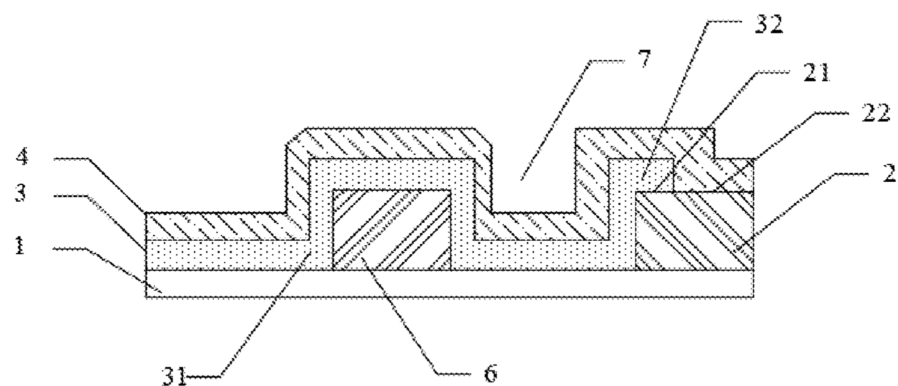
FIG. 4 is a cross-sectional view taken along line BB' of FIG. 2.

As shown in FIG. 3 and FIG. 4, in another embodiment, the outer edge of the extension portion of the light emitting layer 3 may cover a portion of the surface of the first electrode contact portion 2 away from the base substrate 1. The portion of the surface of the first electrode contact portion 2 away from the base substrate 1, that is covered by the light emitting layer 3, may be defined as a preset area 21, and a portion not covered may be a non-preset area 22. The light emitting layer 3 is disposed on the preset area 21, such that the first electrode 4 can be directly overlapped from the light emitting layer 3 to the first electrode contact portion 2, which can prevent the first electrode 4 from being broken when being connected to the first electrode contact portion 2 in an overlapping manner. The number of the preset areas 21 may be multiple, and the non-preset area 22 may be an integral structure or divided into a plurality of parts by the preset area 21.

In order to ensure that the first electrode 4 disposed on the preset area 21 can be connected in an overlapping manner to the upper surface of the first electrode contact portion 2 away from the display area 5 (the surface away from the base substrate 1), a width of the preset area 21 in a first direction (i.e., a direction in which the first electrode contact portion 2 is away from the display area 5, or a width direction) should be smaller than a width of the first electrode contact portion 2 in the first direction. The number of the preset areas 21, the sizes of the preset area 21 in the first direction (width direction) and a second direction (i.e., an annular direction around the first electrode contact portion 2, or a length direction) may be determined depending on the process characteristics and the shape of the display panel, so long as the preset area 21 can exist in the first electrode contact portion 2.

In an embodiment, in order to avoid the alignment deviation during the evaporation process, the width of the preset area 21 may be half of the width of the first electrode contact portion 2. Thus, in preparation of the light emitting layer 3, as long as the alignment deviation of the light emitting layer 3 in the width direction is less than half the width of the first electrode contact portion 2, it can ensure that the light emitting layer 3 is evaporated onto the first electrode contact portion 2 and partially cover the first electrode contact portion 2 in the first direction along the first electrode contact portion 2.

It will be apparent to those skilled in the art that the light emitting layer 3 may have a plurality of extension portions, and the positions, shapes, sizes, and the like of the respective extension portions may be different. For example, in an embodiment, some extensions of the light emitting layer 3 each may be in a form in which the outer edge is flush with the inner edge of the first electrode contact portion 2, and other extension portions of the light emitting layer 3 may be each in a structure in which the extension portion extends to the surface of the first electrode contact portion 2 away from the base substrate 1.

The light emitting layer 3 covers the display area 5 and at least a portion of the isolation area 7. As shown in the shaded portion of FIG. 3, the light emitting layer 3 may include a light emitting layer body 31 and at least one convex portion 32, and the light emitting layer body 31 and the convex portion 32 are of an integral structure. The light emitting layer body 31 covers the display area 5 and a portion of the isolation area 7, and the edge of the light emitting layer body 31 is in the isolation area 7. The convex portion 32 extends to the inner edge of the first electrode contact portion 2 or the preset area 21.

It may be appreciated by those skilled in the art that second electrodes 6 are also arranged in an array at a position between the light emitting layer 3 and the substrate 1 corresponding to the display area 5. The second electrode 6 and the first electrode 4 jointly control the light emission of the light emitting layer 3. Correspondingly, the isolation area 7 is the area between the outer contour of the array of second electrodes 6 and the inner edge of the first electrode contact portion 2.

The edge of the light emitting layer body 31 is located in the isolation area 7, so that it can ensure that the light emitting layer 3 completely covers the second electrodes 6 and the side surfaces of the second electrodes 6, and can prevent the side surface of the first electrode 4 from being connected to the side surface of the second electrode 6. It may be appreciated by those skilled in the art that the preset area 21 may be a preset area on the first electrode contact portion 2 (i.e., the light emitting layer 3 is covered on the preset area 21), or may be a portion of the surface the first electrode contact portion 2 covered by the light emitting layer 3 after it is formed (i.e. the portion of the first electrode contact portion 2 covered by the light emitting layer is defined as the preset area 21).

The length of the edge of the light emitting layer body 31 connected to the convex portion 32 can be adjusted or selected according to process requirements or process characteristics, such that the convex portion 32 can be formed. In an embodiment, in order to reduce the influence on the alignment deviation during evaporation, and ensure that the light emitting layer 3 covers a portion of the surface of the first electrode contact portion 2, the length of the edge of the light emitting layer body 31 connected to the convex portion 32 may be 50% of the length of the edge of the light emitting layer body 31. However, it can be adjusted to other different ratios, such as 30%, 40%, 60%, or 70% according to the process difficulty and the like.

The number of the convex portions 32 may be one or more. When a plurality of convex portions 32 are provided, it means that the plurality of convex portions 32 may be connected to the edge of the light emitting layer body 31 at intervals. The arrangement of the plurality of convex portions 32 can reduce the influence of the vapor deposition on the alignment deviation, such that the light emitting layer 3 can still partially cover the first electrode contact portion 2 when there is an alignment deviation in the vapor deposition.

In an embodiment, as shown in FIG. 9, the display area 5 may be circular, and the first electrode contact portion 2 may be a circle concentric with the display area 5. An orthographic projection of the light emitting layer body 31 on the base substrate 1 is a circle concentric with the display area 5. An orthographic projection of the convex portion 32 on the base substrate 1 is a fan shape centered on the center of the display area 5. An outer radius of the convex portion 32 is smaller than an outer radius of the first electrode contact portion 2 is not smaller than an inner radius of the first electrode contact portion 2. The number of the convex portions 32 may be multiple, and the multiple convex portions 32 are evenly distributed along the edges of the light emitting layer body 31.

For example, the number of the convex portions 32 may be four, and each of the convex portions 32 is a fan shape having a central angle of 45° and an interval between adjacent two convex portions 32 is 45°. The outer diameter of the convex portion 32 may be equal to the average of the large diameter and the small diameter of the first electrode contact portion 2. In this regard, not only the convex portions 32 are evenly distributed on the light emitting layer 3, which can facilitate the preparation of the mask, but also the distance from the edge of the convex portion 32 to the edge of the first electrode contact portion 2 is half of the first electrode contact portion 2, such that during preparation of the light emitting layer, regardless of the direction in which the alignment of the mask is deviated, the convex portion 32 can cover the first electrode contact portion 2, which can ensure the overlapping effect of the first electrode 4 and the first electrode contact portion 2.

In another embodiment, as shown in FIG. 3, the display area 5 may be rectangular, and the first electrode contact portion 2 may be a rectangular ring co-centered with the display area 5. The projection of the light emitting layer body 31 on the base substrate 1 may be rectangular co-centered with the display area 5. An orthographic projection of the convex portion 32 on the base substrate 1 may be a rectangle, and the edge of the convex portion 32 away from the light emitting layer body 31 is located on the surface of the first electrode contact portion 2 away from the base substrate 1. The number of the convex portions 32 may be multiple, and the multiple convex portions 32 may be disposed on the edge of the light emitting layer body 31 at intervals.

For example, the number of the convex portions 32 may be four, and the four convex portions are connected to the four sides of the light emitting layer body 31 in a one-to-one correspondence. Each of the convex portions 32 is connected between an end point and a midpoint of the side of the corresponding light emitting layer body 31, that is, the width of the convex portion 32 in the second direction is half of the width of the light emitting layer body 31 and the convex portion 32 and the light emitting layer body 31 are aligned at one end. The outer edge of the convex portion 32 in the first direction may be in the middle of the inner and outer edges of the corresponding first electrode contact portion 2. Thus, not only the convex portions 32 can be evenly distributed on the light emitting layer 3, which can facilitate the preparation of the mask, but also the distance from the edge of the convex portion 32 to the edge of the first electrode contact portion 2 is half of the width of the first electrode contact portion 2, such that during preparation of the light emitting layer, regardless of the direction in which the alignment of the mask is deviated, the convex portion 32 can cover the first electrode contact portion 2, which can ensure the overlapping effect of the first electrode 4 and the first electrode contact portion 2.

Figure 7:
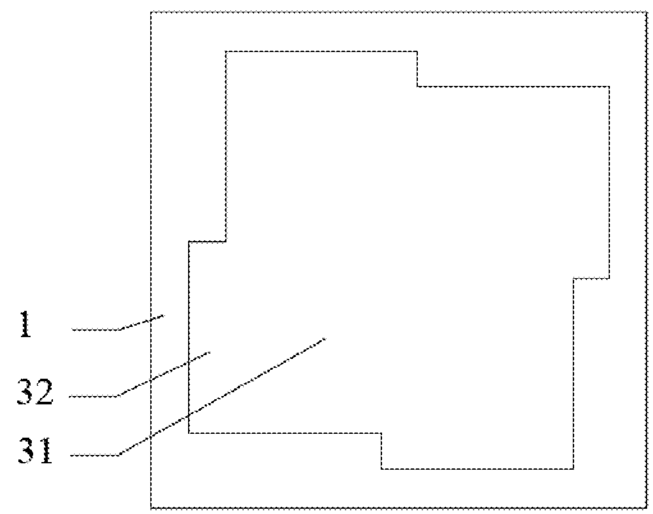
FIG. 7 is a schematic plan view of a light emitting layer according to an embodiment of the present disclosure.

When the light emitting layer 3 is prepared through a mask, the shape of the pattern on the mask determines the shape of the light emitting layer 3. Those skilled in the art can design a suitable mask according to the shape of the display panel to be prepared. For example, when preparing the light emitting layer 3 of the rectangular display panel described above, the outer edge contour of the pattern region may be selected as the mask shown in FIG. 7.

In an embodiment of the present disclosure, a manufacturing method of the above display panel is further provided, which includes the following steps.

In step S110, a base substrate 1 is obtained.

In step S120, a first electrode contact portion 2 is formed around a display area 5 on the base substrate 1, the first electrode contact portion 2 and the display area 5 being separated by an isolation area 7.

In step S130, the light emitting layer 3 is formed on the display area 5 and at least a portion of the isolation area 7, where the light emitting layer 3 extends at least partially to an inner edge of the first electrode contact portion 2 or a surface of the first electrode contact portion 2 away from the base substrate 1.

In step S140, a first electrode 4 is formed on the light emitting layer 3 and a portion of the first electrode contact portion 2 that is not covered by the light emitting layer 3.

In step S130, the technician needs to design a corresponding mask according to the desired outer contour shape of the light emitting layer 3.

An embodiment of the present disclosure further provides a display device, which may include the display panel in the above display panel embodiment. The display device may be part or all of a device, such as a television, a notebook computer, a smart watch, a wristband, a smart phone, or a smart digital display instrument.

The display panel used in the display device of the embodiment of the present disclosure is the same as the display panel in the embodiment of the display panel described above, and therefore has the same advantageous effects, details of which will not be repeated herein. It is to be understood that the present disclosure does not limit its application to the detailed structure and arrangement of the components presented in the specification. The present disclosure can have other embodiments and can be implemented and performed in various manners. The foregoing variations and modifications are intended to fall within the scope of the present disclosure. It is to be understood that the disclosure disclosed and claimed herein extends to all alternative combinations of two or more individual features that are mentioned or apparent in the texts and/or drawings. All of these different combinations constitute a number of alternative aspects of the present disclosure. The embodiments described in the specification are illustrative of the best modes of the present disclosure, and will enable those skilled in the art to utilize the present disclosure.

What is claimed is:

1. A display panel having a display area, wherein the display panel comprises:

a base substrate;

a first electrode contact portion disposed on the base substrate and surrounding the display area, the first electrode contact portion being separated from the display area by an isolation area; and a light emitting layer covering the display area and at least a portion of the isolation area, the light emitting layer extending at least partially to an inner edge of the first electrode contact portion or a surface of the first electrode contact portion away from the base substrate, the light emitting layer comprising:

a light emitting layer body covering the display area and a portion of the isolation area, an edge of the light emitting layer body being in the isolation area; and at least one convex portion extending to the inner edge of the first electrode contact portion or the surface of the first electrode contact portion away from the base substrate, wherein a length of an edge of the light emitting layer body connected to the at least one convex portion is 50% of a length of an edge of the light emitting layer body, and a width of a portion of the light emitting layer covering the first electrode contact portion is uniform; and a first electrode disposed on the light emitting layer and a portion of the first electrode contact portion that is not covered by the light emitting layer.

2. The display panel according to claim 1, wherein:

the light emitting layer extends partially to a surface of the first electrode contact portion away from the base substrate;

a direction in which the first electrode contact portion is away from the display area is a first direction; and a width of the portion the light emitting layer covering the first electrode contact portion in the first direction is smaller than a width of the surface of the first electrode contact portion away from the base substrate in the first direction.

3. The display panel according to claim 2, wherein a width of a portion of the light emitting layer covering the first electrode contact portion in the first direction is 50% of the width of the surface of the first electrode contact portion away from the base substrate in the first direction.

4. The display panel according to claim 1, wherein the at least one convex portion is one of a plurality of convex portions connected to the edge of the light emitting layer body at intervals.

5. The display panel according to claim 1, wherein:

the display area is circular, and the first electrode contact portion is a circle concentric with the display area;

an orthographic projection of the light emitting layer body on the base substrate is a circle concentric with the display area; and an orthographic projection of the at least one convex portion on the base substrate is a fan shape centered on a center of the display area, and an outer radius of the convex portion is smaller than an outer radius of the first electrode contact portion and not smaller than an inner radius of the first electrode contact portion.

6. The display panel according to claim 5, wherein the at least one convex portion is one of a plurality of convex portions evenly distributed along an edge of a body of the light emitting layer.

7. The display panel according to claim 1, wherein:

the display area is rectangular, and the first electrode contact portion is a rectangular ring concentric with the display area;

a projection of the light emitting layer body on the base substrate is a rectangle concentric with the display area; and an orthographic projection of the at least one convex portion on the base substrate is a rectangle, and an edge of the at least one convex portion away from the light emitting layer body is located at the surface of the first electrode contact portion away from the base substrate.

8. The display panel according to claim 7, wherein a number of the convex portions is four, and the four convex portions are connected to four sides of the light emitting layer body in a one-to-one correspondence.

9. The display panel according to claim 7, wherein each of the convex portions is connected between an end point and a midpoint of a side of the corresponding light emitting layer body.

10. The display panel according to claim 1, wherein the base substrate is a silicon-based substrate.

11. The display panel according to claim 1, wherein the display panel is an OLED display panel.

12. A display device comprising a display panel, the display panel comprising:

a base substrate;

a first electrode contact portion disposed on the base substrate and surrounding a display area, the first electrode contact portion being separated from the display area by an isolation area; and a light emitting layer covering the display area and at least a portion of the isolation area, the light emitting layer extending at least partially to an inner edge of the first electrode contact portion or a surface of the first electrode contact portion away from the base substrate, the light emitting layer comprising:

a light emitting layer body covering the display area and a portion of the isolation area, an edge of the light emitting layer body being in the isolation area; and at least one convex portion extending to the inner edge of the first electrode contact portion or the surface of the first electrode contact portion away from the base substrate, wherein a length of an edge of the light emitting layer body connected to the at least one convex portion is 50% of a length of an edge of the light emitting layer body, and a width of a portion of the light emitting layer covering the first electrode contact portion is uniform; and a first electrode disposed on the light emitting layer and a portion of the first electrode contact portion that is not covered by the light emitting layer.

13. The display device according to claim 12, wherein:

the light emitting layer extends partially to a surface of the first electrode contact portion away from the base substrate;

a direction in which the first electrode contact portion is away from the display area is a first direction; and a width of the portion the light emitting layer covering the first electrode contact portion in the first direction is smaller than a width of the surface of the first electrode contact portion away from the base substrate in the first direction.

14. The display device according to claim 13, wherein a width of a portion of the light emitting layer covering the first electrode contact portion in the first direction is 50% of the width of the surface of the first electrode contact portion away from the base substrate in the first direction.

15. The display device according to claim 12, wherein the light emitting layer comprises:

a light emitting layer body covering the display area and a portion of the isolation area, and an edge of the light emitting layer body is in the isolation area; and at least one convex portion extending to the inner edge of the first electrode contact portion or the surface of the first electrode contact portion away from the base substrate.

16. The display device according to claim 15, wherein a length of an edge of the light emitting layer body connected to the at least one convex portion is 50% of a length of an edge of the light emitting layer body.

17. The display device according to claim 15, wherein the at least one convex portion is one a plurality of convex portions connected to the edge of the light emitting layer body at intervals.

* * * * *